US010386400B2

(12) United States Patent
Kawanaka et al.

(10) Patent No.: US 10,386,400 B2
(45) Date of Patent: Aug. 20, 2019

(54) ABNORMALITY DETECTION DEVICE AND METHOD FOR INSULATION AND WELDING

(71) Applicants: FUJITSU TEN LIMITED, Kobe-shi, Hyogo (JP); TOYOTA JIDOSHA KABUSHIKI KAISHA, Toyota-shi, Aichi-ken (JP)

(72) Inventors: Shota Kawanaka, Kobe (JP); Sho Tamura, Kobe (JP); Takahiro Okada, Kobe (JP); Hiromasa Tanaka, Okazaki (JP)

(73) Assignees: FUJITSU TEN LIMITED, Kobe-shi (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 235 days.

(21) Appl. No.: 15/401,354

(22) Filed: Jan. 9, 2017

(65) Prior Publication Data

US 2017/0227589 A1 Aug. 10, 2017

(30) Foreign Application Priority Data

Feb. 10, 2016 (JP) ................................ 2016-023759

(51) Int. Cl.

*G01R 31/00* (2006.01)
*G01R 31/12* (2006.01)
*G01R 31/327* (2006.01)
*G01R 31/02* (2006.01)

(52) U.S. Cl.

CPC ....... *G01R 31/007* (2013.01); *G01R 31/1272* (2013.01); *G01R 31/3277* (2013.01); *G01R 31/025* (2013.01)

(58) Field of Classification Search

CPC combination set(s) only.
See application file for complete search history.

(56) References Cited

U.S. PATENT DOCUMENTS

2010/0244850 A1* 9/2010 Yano ..................... B60L 3/0046 324/510
2013/0002262 A1* 1/2013 Tago .................... G01R 31/006 324/503
2014/0021961 A1* 1/2014 Yamada ............... G01R 31/025 324/503

(Continued)

FOREIGN PATENT DOCUMENTS

JP 2005-149843 A 6/2005
JP 2007-329045 A 12/2007
JP 2009-281986 A 12/2009

(Continued)

*Primary Examiner* — Jay Patidar
(74) *Attorney, Agent, or Firm* — Oliff PLC

(57) ABSTRACT

An abnormality detection device includes a measuring unit 14*c* and a determining unit 14*d*. The measuring unit 14*c* measures, among a power supply, a capacitor, a load circuit, a switch connecting the power supply to the load circuit, and ground of a vehicle body, which are mounted on a vehicle, a first voltage of the capacitor charged by serially connecting the power supply, the capacitor, and the body ground in a state where the switch is controlled to be turned off. The determining unit 14*d* determines that the switch is not fixed in an ON state and an insulation resistance of the vehicle is normal when the first voltage measured by the measuring unit 14*c* is less than a first threshold.

11 Claims, 9 Drawing Sheets

(56) References Cited

U.S. PATENT DOCUMENTS

| | | | |
|---|---|---|---|
| 2015/0022219 | A1 | 1/2015 | Kawamura |
| 2017/0059658 | A1 | 3/2017 | Tanaka |

FOREIGN PATENT DOCUMENTS

| | | | |
|---|---|---|---|
| JP | 2010-019603 | A | 1/2010 |
| JP | 2011-166950 | A | 8/2011 |
| JP | 2012-202723 | A | 10/2012 |
| JP | 2014-020914 | A | 2/2014 |
| JP | 2015-021845 | A | 2/2015 |
| JP | 2015-079730 | A | 4/2015 |
| JP | 2015-214264 | A | 12/2015 |
| WO | 2015/173617 | A1 | 11/2015 |

* cited by examiner

FIG.8A

| | INSULATING STATE OF BATTERY IS NORMAL | INSULATING STATE OF BATTERY IS ABNORMAL |
|---|---|---|
| SMR NORMAL | V=0 REGARDLESS OF ON/OFF OF SMR | V=Vp AT OFF OF SMR<br>V=Vp+VL AT ON OF SMR |
| SMR ABNORMAL | V=VL REGARDLESS OF ON/OFF OF SMR | V=Vp+VL REGARDLESS OF ON/OFF OF SMR |

V: TOTAL CHARGING VOLTAGE OF FLYING CAPACITOR
Vp: CHARGING VOLTAGE CAUSED BY ABNORMALITY OF INSULATING STATE OF BATTERY IN TOTAL CHARGING VOLTAGE OF FLYING CAPACITOR
VL: CHARGING VOLTAGE CAUSED BY ON OF SMR IN TOTAL CHARGING VOLTAGE OF FLYING CAPACITOR

FIG.8B

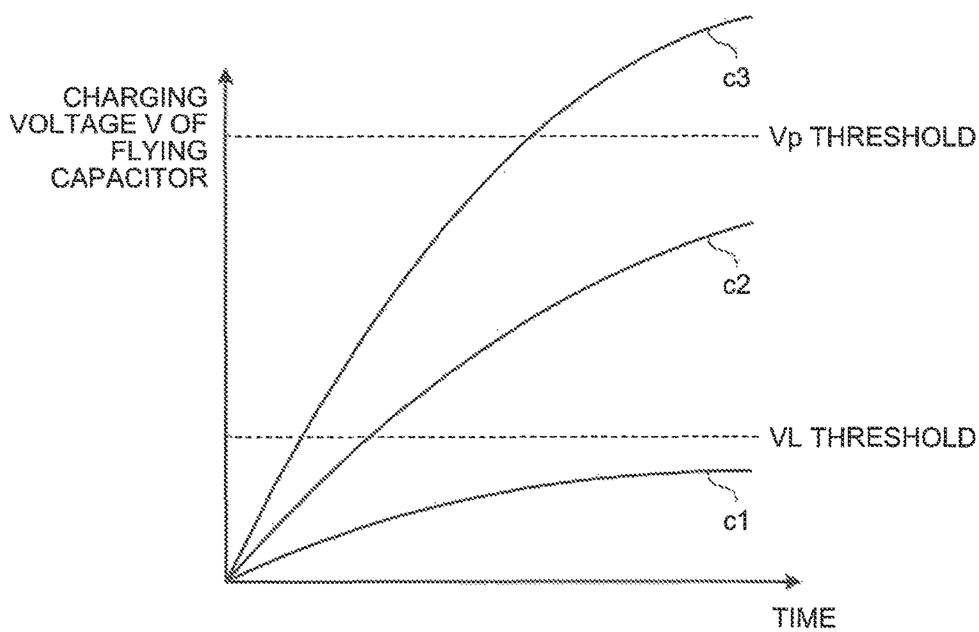

ABNORMALITY DETECTION DEVICE AND METHOD FOR INSULATION AND WELDING

CROSS-REFERENCE TO RELATED APPLICATION

This application is based upon and claims the benefit of priority of the prior Japanese Patent Application No. 2016-023759, filed on Feb. 10, 2016 the entire contents of which are incorporated herein by reference.

FIELD

The embodiments discussed herein are directed to an abnormality detection device and an abnormality detection method.

BACKGROUND

A vehicle such as a hybrid electric vehicle and an electric vehicle widespread recently includes a power supply that supplies power to a motor or the like acting as a power source. The power supply includes an assembled battery that is made by stacking a plurality of storage cells. A voltage output from the power supply is boosted by a booster circuit connected to the power supply via a switch such as a system main relay (SMR), and is supplied to the motor.

Under the configuration, there is a technology for preventing the overcharge of a power supply by using redundant monitoring for monitoring a function of monitoring the overcharge of the power supply on the basis of a charging voltage of a capacitor charged by series connection with the power supply, for example. Moreover, for example, there is a technology for detecting insulation abnormality of a vehicle on the basis of a voltage of a capacitor charged in a state where a power supply, the capacitor, a vehicle insulation resistance, and a vehicle body ground are connected to one another (for example, see Japanese Laid-open Patent Publication No. 2014-020914). Moreover, for example, there is a technology for detecting insulation abnormality of a vehicle and for detecting welding of SMR on the basis of a voltage of a capacitor charged in a state where a power supply, the capacitor, and a booster circuit are connected to one another (for example, see Japanese Laid-open Patent Publications No. 2011-166950 and No. 2012-202723).

However, the conventional technology has a problem that the control processing and the circuit configuration are complicated in that the on/off of a switch of a target for welding detection are alternately controlled and in that a circuit for welding detection different from insulation abnormality detection is provided, for example.

SUMMARY

An abnormality detection device includes a measuring unit and a determining unit. The measuring unit measures, among a power supply, a capacitor, a load circuit, a switch connecting the power supply to the load circuit, and ground of a vehicle body, which are mounted on a vehicle, a first voltage of the capacitor charged by serially connecting the power supply, the capacitor, and the body ground in a state where the switch is controlled to be turned off. The determining unit determines that the switch is not fixed in an ON state and an insulation resistance of the vehicle is normal when the first voltage measured by the measuring unit is less than a first threshold.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 8A is a diagram illustrating charging voltages of the flying capacitor in states of a battery and SMR according to the first embodiment;

FIG. 8B is a diagram illustrating chronological changes in the charging voltages of the flying capacitor in the states of the battery and the SMR according to the first embodiment.

DESCRIPTION OF EMBODIMENTS

Hereinafter, embodiments of an abnormality detection device and an abnormality detection method disclosed in the present application will be described in detail with reference to the accompanying drawings. Moreover, embodiments to be described below mainly illustrate the configuration and process related to the disclosed technology, and thus their explanations for the other configuration and process are omitted. The disclosed technology is not limited to embodiments described below. The embodiments may be appropriately combined within a scope in which the combined embodiments do not contradict each other. In the embodiments, the same components and steps have the same reference numbers, and explanations for the configuration and process described already are omitted.

First Embodiment

In-Vehicle System According to First Embodiment

Figure 1:
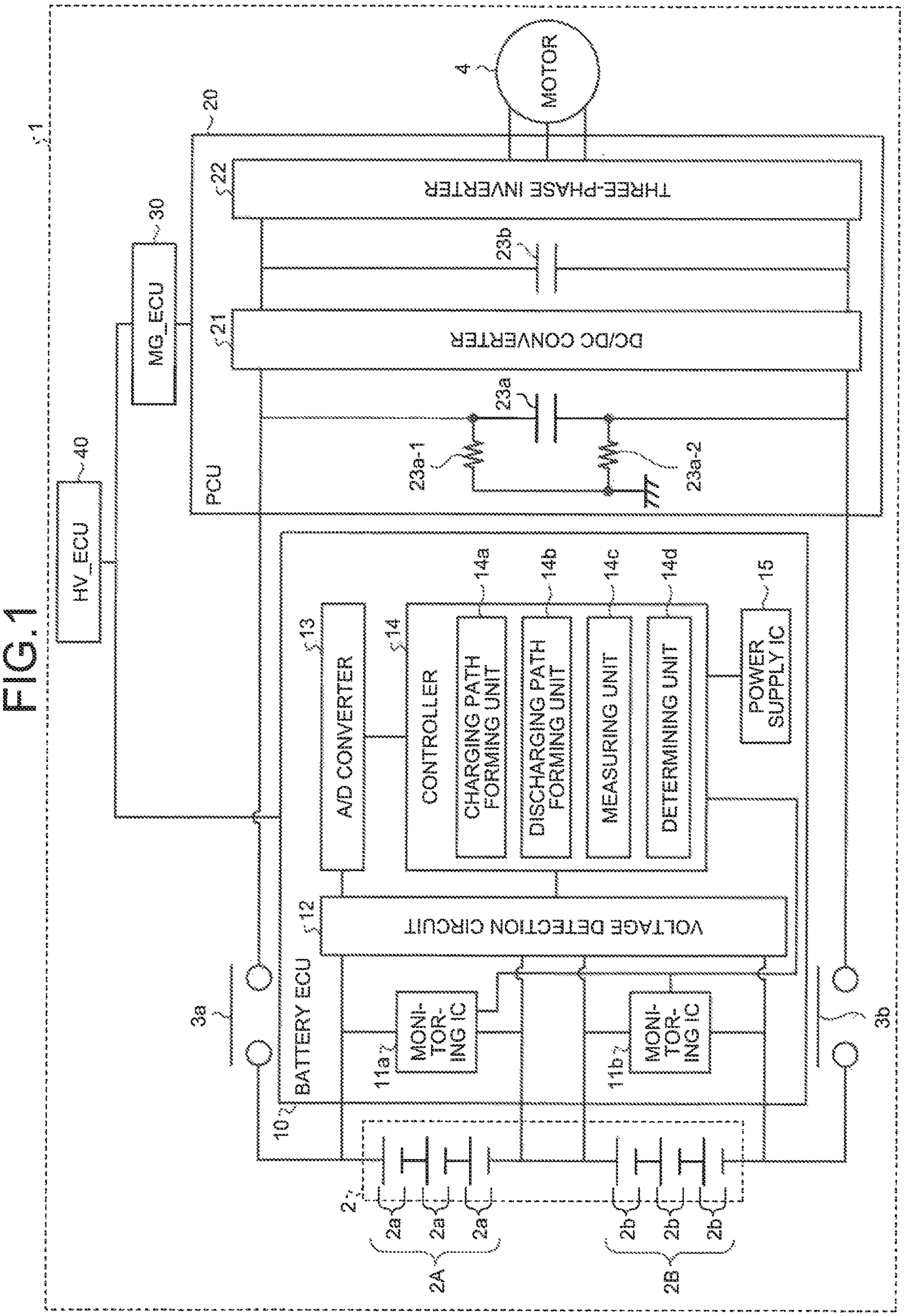
FIG. 1 is a diagram illustrating an example of an in-vehicle system according to a first embodiment.

FIG. 1 is a diagram illustrating an example of an in-vehicle system 1 according to the first embodiment. The in-vehicle system 1 is a system that is mounted on a vehicle such as a hybrid electric vehicle (HEV), an electric vehicle (EV), and a fuel cell vehicle (FCV). The in-vehicle system 1 performs control including charging and discharging of a power supply that supplies power to a motor that is a power source of the vehicle.

The in-vehicle system 1 includes an assembled battery 2, system main relays (SMRs) 3*a* and 3*b*, a motor 4, a battery ECU 10, a PCU (power control unit) 20, an MG_ECU (motor generator ECU) 30, and an HV_ECU (hybrid vehicle ECU) 40. Electrical components such as the PCU 20, the MG_ECU 30, and an air conditioner ECU (not illustrated) are an example of a load circuit. Herein, ECU is an abbreviation of Electric Control Unit.

The assembled battery 2 is a power supply (battery) insulated from a car body that is not illustrated, and is configured to include two or more battery stacks serially connected, for example, two battery stacks 2A and 2B. The battery stacks 2A and 2B are configured to include two or more battery cells serially connected, for example, to respectively include three battery cells 2*a* and three battery cells 2*b*. In other words, the assembled battery 2 is a high-voltage DC power supply.

The number of battery stacks and the number of battery cells are not limited to the above or the illustrated configuration. Moreover, the battery cell can use a lithium-ion secondary battery, a nickel-hydrogen secondary battery, or the like. However, the present embodiment is not limited to this.

The SMR 3*a* is turned on or off by the control of the battery ECU 10 or the HV_ECU 40, and connects the maximum voltage side of the assembled battery 2 to the PCU 20 at the time of ON. Moreover, the SMR 3*b* is turned on or off by the control of the battery ECU 10 or the HV_ECU 40, and connects the minimum voltage side of the assembled battery 2 to the PCU 20 at the time of ON.

Battery ECU According to First Embodiment

The battery ECU 10 is an electronic control unit that performs status monitoring and control of the assembled battery 2. The battery ECU 10 includes a monitoring IC (integrated circuit) 11*a*, a monitoring IC 11*b*, a voltage detection circuit 12, an A/D (analog/digital) converter 13, a controller 14, and a power supply IC 15. The power supply IC 15 supplies power to the monitoring IC 11*a*, the monitoring IC 11*b*, the voltage detection circuit 12, the A/D converter 13, and the controller 14.

The monitoring IC 11*a* is connected to the plurality of battery cells 2*a* to monitor the voltages of the battery cells 2*a*. The monitoring IC 11*a* is further connected to the maximum and minimum voltage sides of the battery stack 2A to monitor the voltage of the battery stack 2A. Moreover, the monitoring IC 11*b* is connected to the plurality of battery cells 2*b* to monitor the voltages of the battery cells 2*b*. The monitoring IC 11*b* is further connected to the maximum and minimum voltage sides of the battery stack 2B to monitor the voltage of the battery stack 2B.

On the contrary, one monitoring IC may be provided to correspond to one battery cell, or one monitoring IC may be provided to correspond to the assembled battery 2. When one monitoring IC is provided to correspond to one battery cell, the controller 14 uses the sum of voltages of the battery stacks monitored by the monitoring ICs as a total voltage of the assembled battery 2. Moreover, when one monitoring IC is provided to correspond to the assembled battery 2, the controller 14 uses a total voltage of the assembled battery 2 monitored by the monitoring IC. The monitoring ICs 11*a* and 11*b* are external devices with respect to the controller 14.

Voltage Detection Circuit

Figure 2:
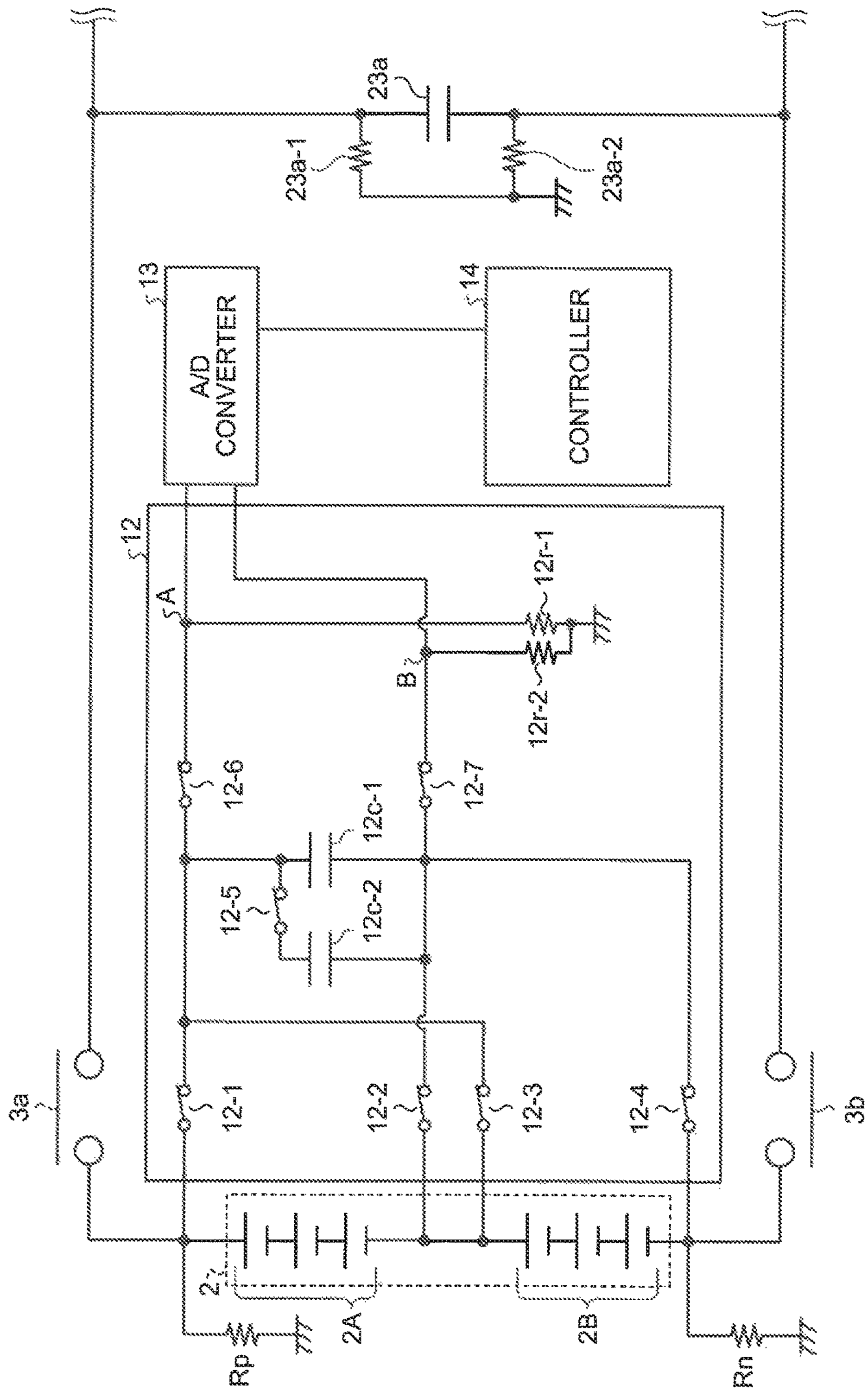
FIG. 2 is a diagram illustrating an example of a voltage detection circuit according to the first embodiment.

FIG. 2 is a diagram illustrating an example of the voltage detection circuit 12 according to the first embodiment. The voltage detection circuit in FIG. 2 merely illustrates an example of a voltage detection circuit, and thus can employ another circuit configuration having the same function. As illustrated in FIG. 2, the voltage detection circuit 12 includes first to seventh switches 12-1 to 12-7, a capacitor 12*c*-1, a capacitor 12*c*-2, a first resistor 12*r*-1, and a second resistor 12*r*-2. For example, a solid state relay (SSR) can be used as the first to seventh switches 12-1 to 12-7. However, the present embodiment is not limited to this.

Herein, the capacitors 12*c*-1 and 12*c*-2 are used as a flying capacitor. When the fifth switch 12-5 is turned on, the capacitors 12*c*-1 and 12*c*-2 enter a parallel-connected state, and the capacitors 12*c*-1 and 12*c*-2 together function as a flying capacitor. On the other hand, when the fifth switch 12-5 is turned off, the capacitor 12*c*-2 is disconnected from the voltage detection circuit 12 and only the capacitor 12*c*-1 functions as a flying capacitor.

Whether the capacitors 12*c*-1 and 12*c*-2 are used as a flying capacitor or only the capacitor 12*c*-1 is used as a flying capacitor can be appropriately changed in accordance with a measurement object based on the voltage of the charged flying capacitor. For example, when only the capacitor 12*c*-1 is used as a flying capacitor, a charging time is shortened relatively because the capacity of the flying capacitor can be reduced relatively. Hereinafter, a case where the fifth switch 12-5 is turned off and only the capacitor 12*c*-1 functions as a flying capacitor will be explained. However, the embodiment is not limited to this. A case is also similar where the fifth switch 12-5 is turned on and the capacitors 12*c*-1 and 12*c*-2 together function as a flying capacitor.

As illustrated in FIG. 2, the positive side of the battery stack 2A is connected to a resistor 23*a*-1 of the PCU 20 via the SMR 3*a*, and the negative side of the battery stack 2B is connected to a resistor 23*a*-2 of the PCU 20 via the SMR 3*b*. The resistance values of the resistors 23*a*-1 and 23*a*-2 are equal to each other.

In the voltage detection circuit 12, the capacitor 12*c*-1 is charged by the voltage of the battery stack 2A, the voltage of the battery stack 2B, and the total voltage of the assembled battery 2. In the voltage detection circuit 12, the voltage of the charged capacitor 12*c*-1 is detected as the voltage of the battery stack 2A, the voltage of the battery stack 2B, and the total voltage of the assembled battery 2.

Specifically, the voltage detection circuit 12 is divided into charging-side and discharging-side paths while placing the capacitor 12*c*-1 therebetween. The charging-side path includes a path in which the capacitor 12*c*-1 is connected in parallel to the assembled battery 2 and the battery stacks 2A and 2B of the assembled battery 2 and the capacitor 12*c*-1 is charged by the voltage of the battery stack 2A, the voltage of the battery stack 2B, and the total voltage of the assembled battery 2. Moreover, the discharging-side path includes a path in which the charged capacitor 12*c*-1 is discharged.

Then, charging and discharging to/from the capacitor 12*c*-1 are controlled by controlling ON and OFF of the first to fourth switches 12-1 to 12-4 and the sixth and seventh switches 12-6 and 12-7.

On the charging-side path of the voltage detection circuit 12, the first switch 12-1 is serially provided between the positive side of the battery stack 2A and the capacitor 12*c*-1 and, the second switch 12-2 is serially provided between the negative side of the battery stack 2A and the capacitor 12*c*-1.

On the charging-side path of the voltage detection circuit 12, the third switch 12-3 is serially provided between the positive side of the battery stack 2B and the capacitor 12*c*-1, and the fourth switch 12-4 is serially provided between the negative side of the battery stack 2B and the capacitor 12*c*-1.

On the discharging-side path of the voltage detection circuit 12, the sixth switch 12-6 is provided on the positive-side path of the battery stacks 2A and 2B, and one end of the sixth switch 12-6 is connected to the capacitor 12*c*-1. Moreover, the seventh switch 12-7 is provided on the negative-side path of the battery stacks 2A and 2B, and one end of the seventh switch 12-7 is connected to the capacitor 12*c*-1.

The other end of the sixth switch 12-6 is connected to the A/D converter 13, and diverges at a branching point A to be connected to the ground of a car body via the first resistor 12*r*-1. Moreover, the other end of the seventh switch 12-7 is connected to the A/D converter 13, and diverges at a branching point B to be connected to the ground of the car body via the second resistor 12*r*-2. The ground of the car body is an example of body ground. Hereinafter, the voltage at the ground point is referred to as "body voltage".

The A/D converter 13 converts an analog value indicative of a voltage at the branching point A of the voltage detection circuit 12 into a digital value, and outputs the converted digital value to the controller 14.

Herein, there is explained charging and discharging of the capacitor 12*c*-1 that are performed for so-called redundant stack monitoring by detecting the voltages of the battery stacks 2A and 2B and the assembled battery 2. A case is also similar where the fifth switch 12-5 is turned on and the capacitors 12*c*-1 and 12*c*-2 are connected to each other in parallel. Moreover, a battery-stack voltage is a voltage that is referred to as a block voltage.

In the voltage detection circuit 12, the capacitor 12*c*-1 is charged for each of the battery stacks 2A and 2B and the assembled battery 2. Hereinafter, a process for charging the capacitor 12*c*-1 with the voltages of the battery stacks 2A and 2B and measuring the voltages of the battery stacks 2A and 2B by using the voltages of the charged capacitor 12*c*-1 is referred to as "stack measurement". The stack measurement may include a process for charging the capacitor 12*c*-1 with the total voltage of the assembled battery 2 and measuring the total voltage of the assembled battery 2 by using the voltage of the capacitor 12*c*-1. Hereinafter, status monitoring that includes charging and discharging of the battery stacks 2A and 2B and the assembled battery 2 performed by stack measurement is referred to as "redundant stack monitoring".

In FIG. 2, when charging the capacitor 12*c*-1 with the voltage of the battery stack 2A, the first and second switches 12-1 and 12-2 is turned on, and the third and fourth switches 12-3 and 12-4 and the sixth and seventh switches 12-6 and 12-7 are turned off. As a result, a path (hereinafter, called "first path") that includes the battery stack 2A and the capacitor 12*c*-1 is formed, and the capacitor 12*c*-1 is charged with the voltage of the battery stack 2A.

Then, after a predetermined time elapses from the formation of the first path, the capacitor 12*c*-1 is discharged. Specifically, the first and second switches 12-1 and 12-2 are turned off, and the sixth and seventh switches 12-6 and 12-7 are turned on. As a result, a path (hereinafter, called "second path") that includes the capacitor 12*c*-1 and the first and second resistors 12*r*-1 and 12*r*-2 is formed, and the capacitor 12*c*-1 is discharged.

Then, because the A/D converter 13 is connected to the other end of the sixth switch 12-6 via the branching point A, the voltage of the capacitor 12*c*-1 is input into the A/D converter 13. The A/D converter 13 converts an analog voltage value input at the time of ON of the sixth and seventh switches 12-6 and 12-7 into a digital value, and outputs the digital value to the controller 14. As a result, it results in detecting the voltage of the battery stack 2A.

Moreover, in FIG. 2, when charging the capacitor 12*c*-1 with the voltage of the battery stack 2B, the third and fourth switches 12-3 and 12-4 are turned on, and the first and second switches 12-1 and 12-2 and the sixth and seventh switches 12-6 and 12-7 are turned off. As a result, a path (hereinafter, called "third path") that includes the battery stack 2B and the capacitor 12*c*-1 is formed, and the capacitor 12*c*-1 is charged with the voltage of the battery stack 2B.

Then, after a predetermined time elapses from the formation of the third path, the capacitor 12*c*-1 is discharged. Specifically, the third and fourth switches 12-3 and 12-4 are turned off, and the sixth and seventh switches 12-6 and 12-7 are turned on. As a result, the second path is formed, and the capacitor 12*c*-1 is discharged.

Then, because the A/D converter 13 is connected to the other end of the sixth switch 12-6 via the branching point A, the voltage of the capacitor 12*c*-1 is input into the A/D converter 13. The A/D converter 13 converts an analog voltage value input at the time of ON of the sixth and seventh switches 12-6 and 12-7 into a digital value, and outputs the digital value to the controller 14. As a result, it results in detecting the voltage of the battery stack 2B.

Moreover, in FIG. 2, when charging the capacitor 12*c*-1 with the total voltage of the assembled battery 2, the first and fourth switches 12-1 and 12-4 are turned on, and the second and third switches 12-2 and 12-3 and the sixth and seventh switches 12-6 and 12-7 are turned off. As a result, a path (hereinafter, called "fourth path") that includes the assembled battery 2 and the capacitor 12*c*-1 is formed, and the capacitor 12*c*-1 is charged with the total voltage of the assembled battery 2.

Then, after a predetermined time elapses from the formation of the fourth path, the capacitor 12*c*-1 is discharged. Specifically, the first and fourth switches 12-1 and 12-4 are turned off, and the sixth and seventh switches 12-6 and 12-7 are turned on. As a result, the second path is formed, and the capacitor 12*c*-1 is discharged.

Then, because the A/D converter 13 is connected to the other end of the sixth switch 12-6 via the branching point A, the voltage of the capacitor 12*c*-1 is input into the A/D converter 13. The A/D converter 13 converts an analog voltage value input at the time of ON of the sixth and seventh switches 12-6 and 12-7 into a digital value, and outputs the digital value to the controller 14. As a result, it results in detecting the total voltage of the assembled battery 2.

Moreover, the voltage detection circuit 12 is provided with the first and second resistors 12*r*-1 and 12*r*-2. A positive-side insulation resistance Rp and a negative-side insulation resistance Rn of the assembled battery 2 are provided outside the voltage detection circuit 12. The insulation resistance Rp is insulation resistance between the total positive voltage of the assembled battery 2 and the body voltage. Moreover, the insulation resistance Rn is insulation resistance between the total negative voltage of the assembled battery 2 and the body voltage. The degradation of vehicle insulation resistance is determined on the basis of the voltage when the capacitor 12*c*-1 is charged by controlling ON and OFF of each switch of the voltage detection circuit 12 to be described later. In the first embodiment, the measurement of vehicle insulation resistance employs a DC (direct current) voltage application method.

In the first embodiment, the insulation resistances Rp and Rn indicate a combined resistance value of an implemented resistance and a resistance virtually indicating insulation against the ground of the car body. However, it does not matter whether it is the implemented resistance or the virtual resistance.

Each resistance value of the insulation resistances Rp and Rn is a sufficiently large value, for example, a few MΩ, as currents are not almost carried at the normal time. However, at the abnormal time when the insulation resistances Rp and Rn are degraded, each resistance value is decreased as currents are carried, for example, by the short-circuit between the assembled battery 2 and the ground of the car body or by holding them in a state close to the short-circuit.

Herein, there is explained charging and discharging of the capacitor 12*c*-1 which are performed to detect the degradation of the insulation resistances Rp and Rn. A measurement process for detecting the degradation of the insulation resistance Rp is referred to as "Rp measurement". In the Rp measurement, the fourth and sixth switches 12-4 and 12-6 are turned on, and the first to third switches 12-1 to 12-3 and the seventh switch 12-7 are turned off. As a result, the insulation resistance Rp, the negative side of the battery stack 2B, the fourth switch 12-4, the capacitor 12*c*-1, the sixth switch 12-6, the first resistor 12*r*-1, and the ground of the car body are connected to one another.

In other words, a path (hereinafter, called "fifth path") that links the insulation resistance Rp, the negative side of the battery stack 2B, the fourth switch 12-4, the capacitor 12*c*-1, the sixth switch 12-6, the first resistor 12*r*-1, and the ground of the car body is formed. In this case, when the resistance value of the insulation resistance Rp is normal, the fifth path does not almost carry currents, and thus the capacitor 12*c*-1 is not charged. On the other hand, when the insulation resistance Rp is degraded to decrease its resistance value, the fifth path carries currents, and thus the capacitor 12*c*-1 is charged with a positive polarity (positive voltage).

Then, after a predetermined time, for example, a time shorter than a time required for full charge of the capacitor 12*c*-1 elapses from the formation of the fifth path, the fourth switch 12-4 is turned off. Then, the seventh switch 12-7 is turned on along with OFF of the fourth switch 12-4 to form the second path, and thus the capacitor 12*c*-1 is discharged.

Then, because the A/D converter 13 is connected to the other end of the sixth switch 12-6 via the branching point A, the voltage of the capacitor 12*c*-1 is input into the A/D converter 13. The A/D converter 13 converts an analog voltage value (hereinafter, called "voltage VRp") input at the time of OFF of the fourth switch 12-4 and ON of the seventh switch 12-7 into a digital value, and outputs the digital value to the controller 14. As a result, it results in detecting the voltage VRp. The controller 14 detects the degradation of the insulation resistance Rp on the basis of the voltage VRp.

When the SMRs 3*a* and 3*b* are controlled to an ON state in the case of the Rp measurement, the capacitor 12*c*-1 that is a flying capacitor is charged with electric charge corresponding to the voltage of the resistor 23*a*-1 because the resistor 23*a*-1 is added onto the fifth path. Therefore, the welding and firmly-fixing of the SMR 3*a* can be detected because the voltage by electric charge charged into the capacitor 12*c*-1 is not changed even if the SMR 3*a* is controlled between on and off when the SMR 3*a* is welded and firmly fixed in an ON state.

Moreover, a measurement process for detecting the degradation of the insulation resistance Rn is referred to as "Rn measurement". In the Rn measurement, the first and seventh switches 12-1 and 12-7 are turned on, and the second to fourth switches 12-2 to 12-4 and the sixth switch 12-6 are turned off. As a result, the insulation resistance Rn, the positive side of the battery stack 2A, the first switch 12-1, the capacitor 12*c*-1, the seventh switch 12-7, the second resistor 12*r*-2, and the ground of the car body are connected to one another.

In other words, a path (hereinafter, called "sixth path") that links the insulation resistance Rn, the positive side of the battery stack 2A, the first switch 12-1, the capacitor 12*c*-1, the seventh switch 12-7, the second resistor 12*r*-2, and the ground of the car body is formed. In this case, when the resistance value of the insulation resistance Rn is normal, the sixth path does not almost carry currents, and thus the capacitor 12*c*-1 is not charged. On the other hand, when the insulation resistance Rn is degraded to decrease its resistance value, it results in conducting the sixth path.

Then, after a predetermined time, for example, a time shorter than a time required for full charge of the capacitor 12*c*-1 elapses from the formation of the sixth path, the first switch 12-1 is turned off. Then, the sixth switch 12-6 is turned on along with OFF of the first switch 12-1 to form the second path, and thus the capacitor 12*c*-1 is discharged.

Then, because the A/D converter 13 is connected to the other end of the sixth switch 12-6 via the branching point A, the voltage of the capacitor 12*c*-1 is input into the A/D converter 13. The A/D converter 13 converts an analog voltage value (hereinafter, called "voltage VRn") input at the time of OFF of the first switch 12-1 and ON of the sixth switch 12-6 into a digital value, and outputs the digital value to the controller 14. As a result, it results in detecting the voltage VRn. The controller 14 detects the degradation of the insulation resistance Rn on the basis of the voltage VRn.

When the SMRs 3*a* and 3*b* are controlled to an ON state in the case of the Rn measurement, the capacitor 12*c*-1 that is a flying capacitor is charged with electric charge corresponding to the voltage of the resistor 23*a*-2 because the resistor 23*a*-2 is added onto the sixth path. Therefore, the welding and firmly-fixing of the SMR 3*b* can be detected because the voltage by electric charge charged into the capacitor 12*c*-1 is not changed even if the SMR 3*b* is controlled between on and off when the SMR 3*b* is welded and firmly fixed in an ON state.

In the case of the Rp measurement and the Rn measurement in the same cycle, the SMRs 3*a* and 3*b* continue the same state of ON or OFF. Specifically, the Rp measurement and the Rn measurement are performed in the state where the SMRs 3*a* and 3*b* are turned off during a period of time, and thus the voltages VRp and VRn are measured and the voltage VRp+VRn is computed. Moreover, the Rp measurement and the Rn measurement are performed in the state where the SMRs 3*a* and 3*b* are turned on during the other period of time, and thus the voltages VRp and VRn are measured and the voltage VRp+VRn is computed.

About A/D Converter

The A/D converter 13 detects an analog voltage output from the voltage detection circuit 12 at the branching point A (FIG. 2), and converts the analog voltage into a digital voltage. Then, the A/D converter 13 outputs the converted digital voltage to the controller 14. Moreover, the A/D converter 13 converts an input voltage into a voltage within a predetermined range to detect the voltage.

About Controller

The controller 14 is a processing unit such as a microcomputer that includes a central processing unit (CPU), a random access memory (RAM), and a read only memory (ROM). The controller 14 controls IG_ON (ignition on) and IG_OFF (ignition off) of the in-vehicle system 1. Moreover, the controller 14 controls ON and OFF of the SMRs 3*a* and 3*b*. Moreover, the controller 14 controls the whole of the battery ECU 10 that includes the monitoring IC 11*a*, the monitoring IC 11*b*, the voltage detection circuit 12, the A/D converter 13, and the like. The controller 14 includes a charging path forming unit 14*a*, a discharging path forming unit 14*b*, a measuring unit 14*c*, and a determining unit 14*d*.

The charging path forming unit 14*a* controls ON and OFF of the first to seventh switches 12-1 to 12-7 (see FIG. 2) included in the voltage detection circuit 12 to form charging paths in the voltage detection circuit 12. Moreover, the discharging path forming unit 14*b* controls ON and OFF of the first to seventh switches 12-1 to 12-7 included in the voltage detection circuit 12 to form discharging paths in the voltage detection circuit 12.

Switching patterns of the SMRs 3*a* and 3*b* and the first to seventh switches 12-1 to 12-7 are previously stored in a storage device such as RAM and ROM. Then, the charging path forming unit 14*a* and the discharging path forming unit 14*b* read out the switching patterns from the storage device at an appropriate timing to form a charging path or a discharging path.

When the discharging path is formed by the discharging path forming unit 14*b*, the measuring unit 14*c* detects the voltage of the charged capacitor 12*c*-1 via the A/D converter 13.

Specifically, the measuring unit 14*c* measures the voltage VRp on the basis of the voltage of the charged capacitor 12*c*-1. Similarly, the measuring unit 14*c* measures the voltage VRn on the basis of the voltage of the charged capacitor 12*c*-1.

The determining unit 14*d* detects the degradation of the insulation resistances Rp and Rn and the welding in the ON state of the SMR 3*a* or 3*b* on the basis of the voltages VRp and VRn of the capacitor 12*c*-1, the total voltage of the assembled battery 2, and the like, which are measured by ON and OFF of the SMRs 3*a* and 3*b*. Moreover, the total voltage of the assembled battery 2 and the like may be a measured value, or may be a value acquired from the HV_ECU 40 or the monitoring ICs 11*a* and 11*b*. Herein, when acquiring the total voltage and boosted voltage of the assembled battery 2, this acquisition synchronizes with the measurement of the voltages VRp and VRn. Then, the determining unit 14*d* outputs information, which indicates the determination result (insulation abnormality detection) of the degradation of the insulation resistances Rp and Rn and the welding in the ON state of the SMR 3*a* or 3*b*, to the HV_ECU 40 (see FIG. 1) that is a high-order device.

In other words, when the degradation of the insulation resistances Rp and Rn or the welding in the ON state of the SMR 3*a* or 3*b* comes about, a voltage charged into the capacitor 12*c*-1 increases in the state where the SMRs 3*a* and 3*b* are controlled to be turned off. As a result, the degradation of the insulation resistances Rp and Rn or the welding in the ON state of the SMR 3*a* or 3*b* is detected when the voltage of the charged capacitor 12*c*-1 increases.

For example, it is assumed that the measuring unit 14*c* measures the voltages VRp and VRn of the capacitor 12*c*-1 charged by the formation of the fifth and sixth paths in the state where the SMRs 3*a* and 3*b* are controlled by the controller 14 to be turned off when the in-vehicle system 1 is set to IG_ON. At this time, the determining unit 14*d* detects that there is a possibility that the degradation of the insulation resistance Rp or Rn or the welding in the ON state of the SMR 3*a* or 3*b* comes about if the voltage VRp+VRn is not less than a threshold “1”. Moreover, the determining unit 14*d* detects that the present state is a normal state in that both of the degradation of the insulation resistances Rp and Rn and the welding in the ON state of the SMRs 3*a* and 3*b* do not come about if the voltage VRp+VRn is less than the threshold “1”.

Furthermore, when the determining unit 14*d* detects that there is a possibility that the degradation of the insulation resistance Rp or Rn or the welding in the ON state of the SMR 3*a* or 3*b* comes about, the measuring unit 14*c* executes the next process. In other words, the measuring unit 14*c* measures the voltages VRp and VRn of the capacitor 12*c*-1 respectively charged by the fifth and sixth paths in the state where the SMRs 3*a* and 3*b* are controlled by the controller 14 to be turned on. Then, the determining unit 14*d* detects that there is a possibility that the degradation of the insulation resistance Rp or Rn comes about if the voltage VRp+VRn is not less than a threshold “2”. On the other hand, the determining unit 14*d* detects that there is a possibility that the welding in the ON state of the SMR 3*a* or 3*b* comes about if the voltage VRp+VRn is less than the threshold “2”.

When there is a possibility that the degradation of the insulation resistance Rp or Rn comes about, the determining unit 14*d* performs a threshold determination on the voltage VRp+VRn, and determines whether or not the degradation of the insulation resistance Rp or Rn comes about. Moreover, when there is a possibility that the welding in the ON state of the SMR 3*a* or 3*b* comes about, the determining unit 14*d* performs a comparison determination on the voltages VRp and VRn, and determines which of the SMRs 3*a* and 3*b* is welded. Then, the determining unit 14*d* notifies the HV_ECU 40 of a detection result.

The threshold determination and comparison determination are not limited to the determination of a difference. These determinations may be the determination of a ratio. Moreover, the thresholds “1” and “2” may be a value based on specifications, or may be a value based on statistical processing on statistics in the range of values of the voltage VRp+VRn in which the misdetection of the abnormality does not occur.

About PCU

The PCU 20 boosts a source voltage to be supplied to the motor 4 and the electric components of the vehicle, and also converts the source voltage from a direct-current voltage into an alternate-current voltage. As illustrated in FIG. 1, the PCU 20 is connected to the positive and negative sides of the assembled battery 2. The PCU 20 includes a DC/DC converter 21, a three-phase inverter 22, a low-voltage smoothing capacitor 23*a* (hereinafter, called “VL”), the resistors 23*a*-1 and 23*a*-2, and a high-voltage smoothing capacitor 23*b* (hereinafter, called “VH”). In the low-voltage smoothing capacitor 23*a*, the positive side is connected to the resistor 23*a*-1 and the negative side is connected to the resistor 23*a*-2. The resistors 23*a*-1 and 23*a*-2 are grounded.

About MG_ECU

The MG_ECU 30 is an electronic control unit that performs status monitoring and control of the PCU 20. Specifically, the MG_ECU 30 monitors operating states of the DC/DC converter 21 and the three-phase inverter 22 and charging states of the low-voltage smoothing capacitor 23*a* and the high-voltage smoothing capacitor 23*b*. Then, the MG_ECU 30 acquires information on the presence or absence of boosting and the boosted voltage in the PCU 20, and notifies the HV_ECU 40 as a high-order device of the information. Moreover, the MG_ECU 30 controls operations of the PCU 20 in accordance with the instructions of the HV_ECU 40.

About HV_ECU

The HV_ECU 40 performs vehicle control that includes the control of the battery ECU 10 and the MG_ECU 30 in accordance with the notification of a monitoring result such as a charging state of the assembled battery 2 from the battery ECU 10 and information on the presence or absence of boosting and the boosted voltage in the PCU 20 from the MG_ECU 30.

About Insulation and Welding Detection Process According to First Embodiment

Figure 3A:
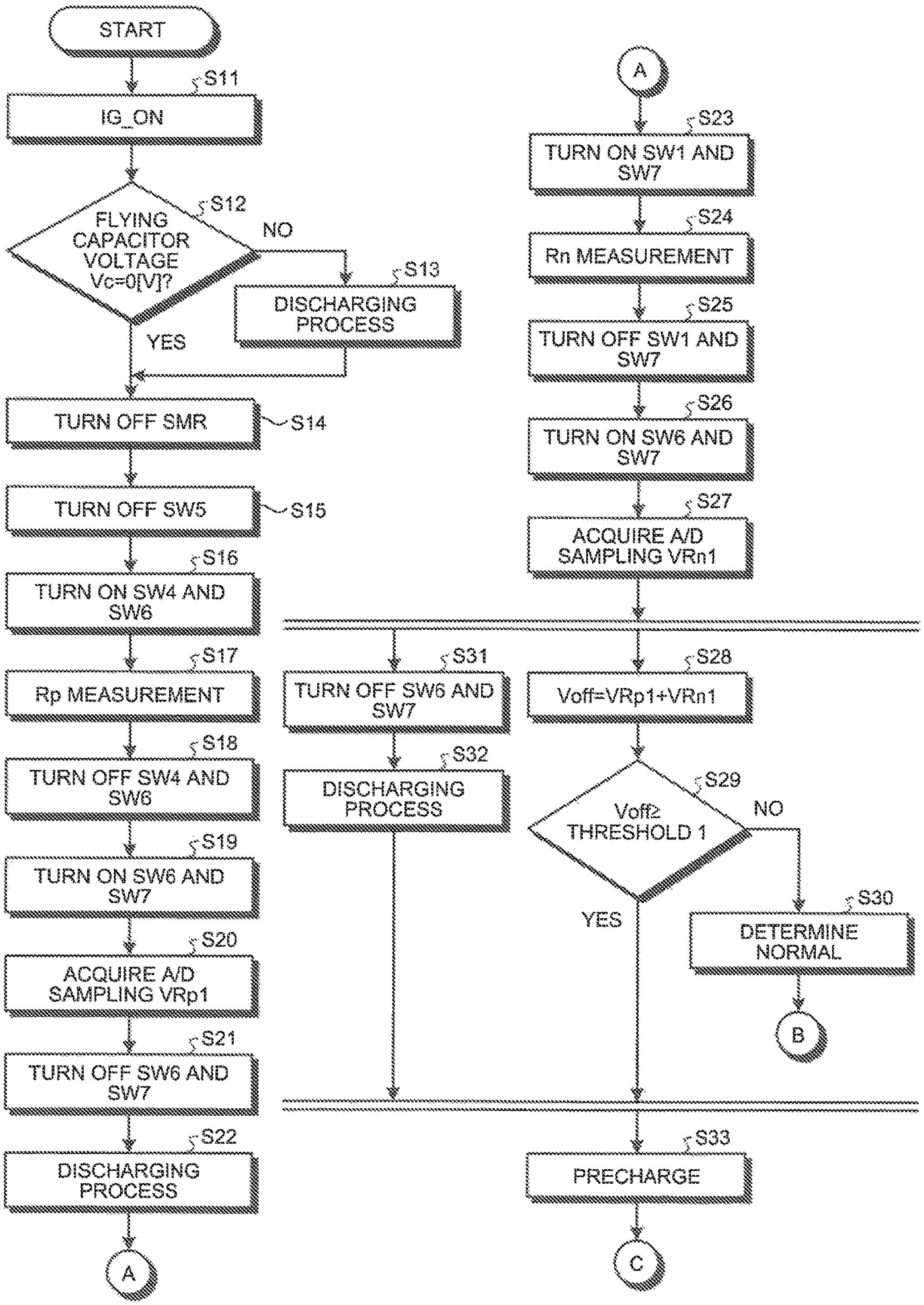
FIGS. 3A and 3B are flowcharts illustrating examples of an insulation and welding detection process according to the first embodiment.
Figure 3B:
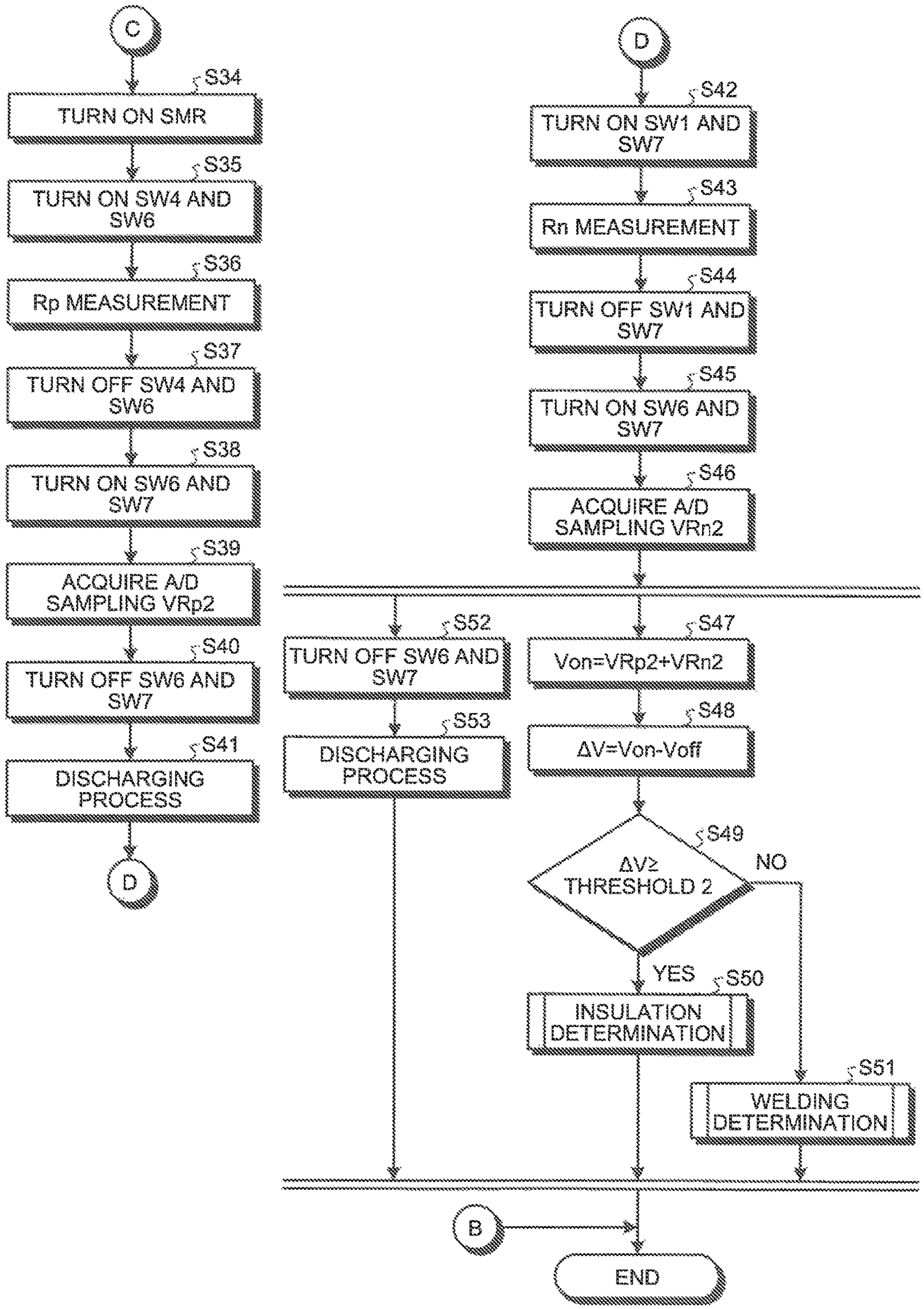

FIGS. 3A and 3B are flowcharts illustrating examples of an insulation and welding detection process according to the first embodiment. The insulation and welding detection process according to the first embodiment is performed by the controller 14 of the battery ECU 10 with IG_ON in the in-vehicle system 1 as a start.

Hereinafter, the first to fourth switches 12-1 to 12-4 illustrated in FIG. 2 are respectively abbreviated to "SW1", "SW2", "SW3", and "SW4". Similarly, the fifth to seventh switches 12-5 to 12-7 illustrated in FIG. 2 are respectively abbreviated to "SW5", "SW6", and "SW7". Moreover, the SMRs 3*a* and 3*b* illustrated in FIG. 2 are respectively abbreviated to "SMR_B" (SMR of B axis) and "SMR_G" (SMR of G axis).

First, as illustrated in FIG. 3A, the controller 14 sets the vehicle to IG_ON (Step S11). Next, the measuring unit 14*c* determines whether a voltage Vc of the flying capacitor (namely, capacitor 12*c*-1) is zero (or substantially zero), namely, is in the sufficiently discharged state (Step S12). When the voltage Vc of the flying capacitor is zero (Step S12: Yes), the measuring unit 14*c* moves the process to Step S14. On the other hand, when the voltage Vc of the flying capacitor is not zero (Step S12: No), the measuring unit 14*c* moves the process to Step S13.

In Step S13, the discharging path forming unit 14*b* forms a discharging path, and performs a discharging process of the flying capacitor (namely, capacitor 12*c*-1). When Step S13 is terminated, the controller 14 moves the process to Step S14.

In Step S14, the controller 14 together turns off the SMR_B and the SMR_G (namely, SMRs 3*a* and 3*b*). Next, the charging path forming unit 14*a* turns off the SW5 to disconnect the capacitor 12*c*-2 from the voltage detection circuit 12, and thus only the capacitor 12*c*-1 constitutes the flying capacitor (Step S15). Therefore, the process can be quickly performed by Step S15 by using the flying capacitor that is speedily charged without overhead such as relatively small-capacity pre-charge. When there is not a switching configuration of the flying capacitor, Step S15 is omitted.

Next, the charging path forming unit 14*a* turns on the SW4 and SW6 (Step S16). The charging path of the fifth path as described above is formed by Step S16, and the Rp measurement is performed and the flying capacitor is charged for a predetermined time (Step S17). Next, the charging path forming unit 14*a* turns off the SW4 and SW6 (Step S18). Next, the discharging path forming unit 14*b* turns on the SW6 and SW7 (Step S19). Next, the measuring unit 14*c* acquires a voltage VRp1 on the basis of the voltage of the flying capacitor sampled by the A/D converter 13 (Step S20). Next, the discharging path forming unit 14*b* turns off the SW6 and SW7 (Step S21), and performs a discharging process of the flying capacitor (Step S22).

Steps S16 to S22 corresponds to the Rp measurement. Moreover, in order to equalize a variation of the boosted voltage in charging of the flying capacitor and the total voltage of the assembled battery 2, an average of voltages acquired by repeating Step S16 to S22 by a predetermined number of times may be set as the final voltage VRp1.

Next, the charging path forming unit 14*a* turns on the SW1 and SW7 (Step S23). As the result of Step S23, the charging path of the sixth path as described above is formed, and the Rn measurement is performed and the flying capacitor is charged for a predetermined time (Step S24). Next, the charging path forming unit 14*a* turns off the SW1 and SW7 (Step S25). Next, the discharging path forming unit 14*b* turns on the SW6 and SW7 (Step S26). Next, the measuring unit 14*c* acquires a voltage VRn1 on the basis of the voltage of the flying capacitor sampled by the A/D converter 13 (Step S27).

When Step S27 is terminated, the process of Steps S28 to S30 and the process of Steps S31 and S32 are performed concurrently.

In Step S28, the measuring unit 14*c* computes a voltage Voff by using Voff=VRp1+VRn1. Next, the determining unit 14*d* determines whether the voltage Voff is not less than the threshold "1" (Step S29). When the voltage Voff is not less than the threshold "1" (Step S29: Yes), the determining unit 14*d* moves the process to Step S33. On the other hand, when the voltage Voff is less than the threshold "1" (Step S29: No), the determining unit 14*d* moves the process to Step S30. In Step S30, the determining unit 14*d* determines that the present state is a normal state in which both of the degradation of the insulation resistances Rp and Rn and the welding in the ON state of the SMRs 3*a* and 3*b* do not come about. When Step S30 is terminated, the controller 14 terminates the insulation and welding detection process.

On the other hand, in Step S31, the discharging path forming unit 14*b* turns off the SW6 and SW7 and turns on the SW2 and SW3. As the result of Step S31, the discharging process of the flying capacitor is performed (Step S32). When Step S32 is terminated, the controller 14 moves the process to Step S33.

In Step S33, the controller 14 performs the pre-charge of the flying capacitor. Moreover, when the flying capacitor has a sufficiently small capacity not to need the pre-charge, the pre-charge of Step S33 can be omitted.

Steps S23 to S27, S31, and S32 correspond to the Rn measurement. Moreover, in order to equalize a variation of the boosted voltage in charging of the flying capacitor and the total voltage of the assembled battery 2, an average of voltages acquired by repeating Steps S23 to S27, S31, and S32 by a predetermined number of times may be set as the final voltage VRn1.

The process group of the Rp measurement of Steps S16 to S22 and the process group of the Rn measurement of Steps S23 to S27, S31, and S32 may be interchanged in units of a process group without changing a process order in each process group. In other words, the Rp measurement may be performed after the Rn measurement.

Next, as illustrated in FIG. 3B, the controller 14 controls the SMRs (SMR_B and SMR_G, namely, SMRs 3*a* and 3*b*) to be turned on (Step S34). Next, the charging path forming unit 14*a* turns on the SW4 and SW6 (Step S35). The charging path of the fifth path as described above is formed by Step S35, and the Rp measurement is performed and the flying capacitor is charged for a predetermined time (Step S36).

Next, the charging path forming unit 14*a* turns off the SW4 and SW6 (Step S37). Next, the discharging path forming unit 14*b* turns on the SW6 and SW7 (Step S38). Next, the measuring unit 14*c* acquires a voltage VRp2 on the basis of the voltage of the flying capacitor sampled by the A/D converter 13 (Step S39). Next, the discharging path forming unit 14*b* turns off the SW6 and SW7 (Step S40), and performs the discharging process of the flying capacitor (Step S41).

Steps S35 to S41 corresponds to the Rp measurement. Moreover, in order to equalize a variation of the boosted voltage in charging of the flying capacitor and the total voltage of the assembled battery 2, an average of voltages acquired by repeating Steps S35 to S41 by a predetermined number of times may be set as the final voltage VRp2.

Next, the charging path forming unit 14*a* turns on the SW1 and SW7 (Step S42). As the result of Step S42, the charging path of the sixth path as described above is formed, and the Rn measurement is performed and the flying capacitor is charged for a predetermined time (Step S43). Next, the charging path forming unit 14*a* turns off the SW1 and SW7 (Step S44). Next, the discharging path forming unit 14*b* turns on the SW6 and SW7 (Step S45). Next, the measuring unit 14*c* acquires a voltage VRn2 on the basis of the voltage of the flying capacitor sampled by the A/D converter 13 (Step S46).

When Step S46 is terminated, the process of Steps S47 to S50, and S51 and the process of Steps S52 and S53 are performed concurrently.

In Step S47, the measuring unit 14*c* computes a voltage Von by using Von=VRp2+VRn2. Next, the measuring unit 14*c* computes a voltage ΔV by using ΔV=Von−Voff (Step S48). Next, the determining unit 14*d* determines whether the voltage ΔV is not less than the threshold “2” (Step S49). When the voltage ΔV is not less than the threshold “2” (Step S49: Yes), the determining unit 14*d* moves the process to Step S50. On the other hand, when the voltage ΔV is less than the threshold “2” (Step S49: No), the determining unit 14*d* moves the process to Step S51. In Step S50, the determining unit 14*d* executes an insulation determination process for determining the degradation of the insulation resistance Rp or Rn, which is described below with reference to FIG. 4. On the other hand, in Step S51, the determining unit 14*d* executes a welding determination process for determining the welding in the ON state of the SMR_B or the SMR_G (SMR 3*a* or 3*b*), which is described below with reference to FIG. 5. When Step S50 or S51 is terminated, the controller 14 terminates the insulation and welding detection process.

On the other hand, in Step S52, the discharging path forming unit 14*b* turns off the SW6 and SW7 and turns on the SW2 and SW3. As the result of Step S52, the discharging process of the flying capacitor is performed (Step S53). When Step S53 is terminated, the controller 14 terminates the insulation and welding detection process.

Steps S42 to S46, S52, and S53 correspond to the Rn measurement. Moreover, in order to equalize a variation of the boosted voltage in charging of the flying capacitor and the total voltage of the assembled battery 2, an average of voltages acquired by repeating Steps S42 to S46, S52, and S53 by a predetermined number of times may be set as the final voltage VRn2.

The process group of the Rp measurement of Steps S35 to S41 and the process group of the Rn measurement of Steps S42 to S46, S52, and S53 may be interchanged in units of a process group without changing a process order in each process group. In other words, the Rp measurement may be performed after the Rn measurement.

About Insulation Determination Process According to First Embodiment

Figure 4:
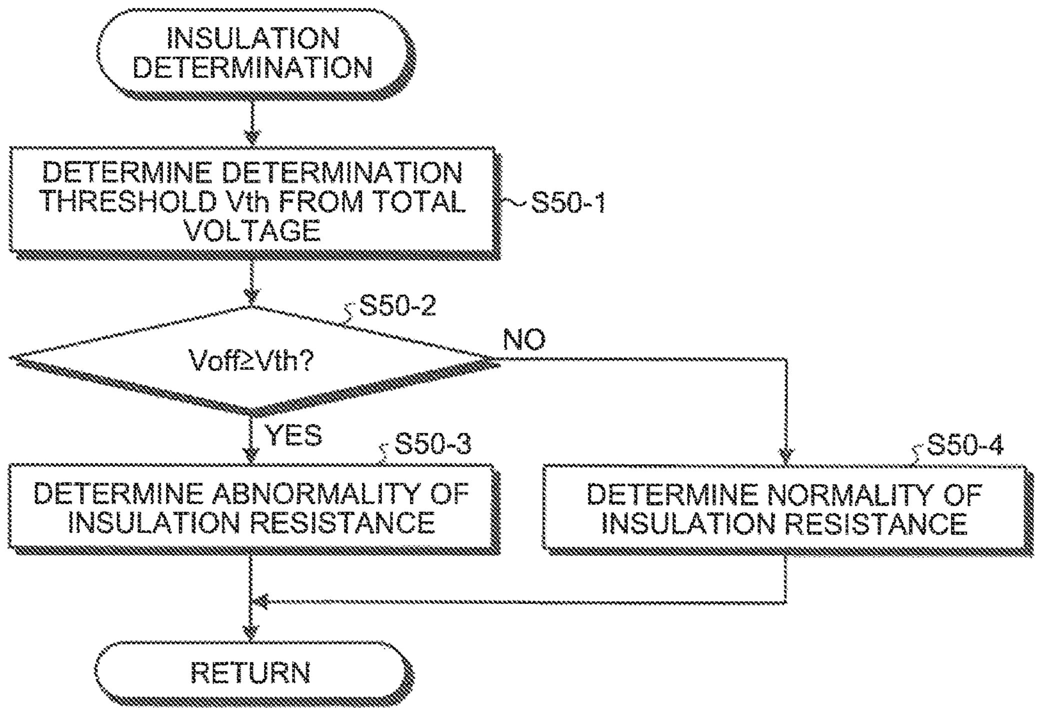
FIG. 4 is a flowchart illustrating an example of an insulation determination process according to the first embodiment.

FIG. 4 is a flowchart illustrating an example of an insulation determination process according to the first embodiment. In FIG. 4, a subroutine of Step S50 in FIG. 3B is illustrated.

First, the determining unit 14*d* determines a determination threshold Vth from the total voltage of the assembled battery 2 (Step S50-1). Next, the determining unit 14*d* determines whether it is Voff≥Vth (Step S50-2). When it is determined that it is Voff≥Vth (Step S50-2: Yes), the determining unit 14*d* moves the process to Step S50-3. On the other hand, when it is determined that it is Voff<Vth (Step S50-2: No), the determining unit 14*d* moves the process to Step S50-4.

In Step S50-3, the determining unit 14*d* detects the degradation of the insulation resistance Rp or Rn, and determines that the insulation resistance has abnormality. On the other hand, in Step S50-4, the determining unit 14*d* does not detect the degradation of the insulation resistances Rp and Rn, and determines that the insulation resistance has normality. When Step S50-3 or S50-4 is terminated, the determining unit 14*d* terminates the insulation determination process to terminate the insulation and welding detection process of FIG. 3B.

About Welding Determination Process According to First Embodiment

Figure 5:
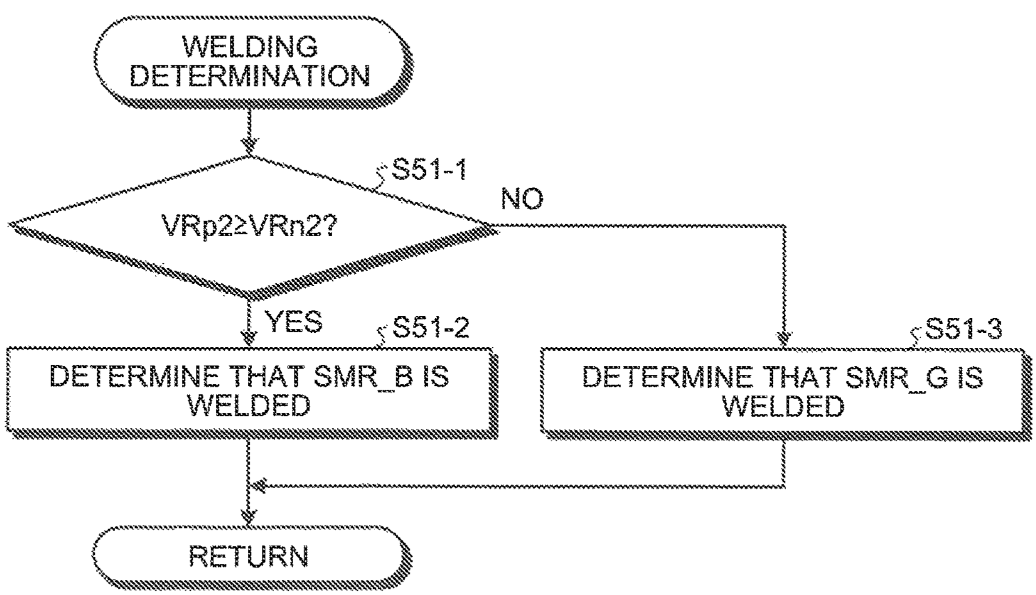
FIG. 5 is a flowchart illustrating an example of a welding determination process according to the first embodiment.

FIG. 5 is a flowchart illustrating an example of a welding determination process according to the first embodiment. In FIG. 5, a subroutine of Step S51 in FIG. 3B is illustrated.

First, the determining unit 14*d* determines whether it is VRp2≥VRn2 with respect to the voltages VRp2 and VRn2 (Step S51-1). In the case of VRp2≥VRn2 (Step S51-1: Yes), the determining unit 14*d* moves the process to Step S51-2. On the other hand, in the case of VRp2<VRn2 (Step S51-1: No), the determining unit 14*d* moves the process to Step S51-3.

In Step S51-2, the determining unit 14*d* determines that the SMR_B (namely, SMR 3*a*) is welded in the ON state. On the other hand, in Step S51-3, the determining unit 14*d* determines that the SMR_G (namely, SMR 3*b*) is welded in the ON state. Moreover, in the case of VRp2=VRn2 in Step S51-1, the determining unit 14*d* may determine that both of the SMR_B (namely, SMR 3*a*) and the SMR_G (namely, SMR 3*b*) are welded in the ON state. When Step S51-2 or S51-3 is terminated, the determining unit 14*d* terminates the welding determination process to terminate the insulation and welding detection process of FIG. 3B.

Figure 6:
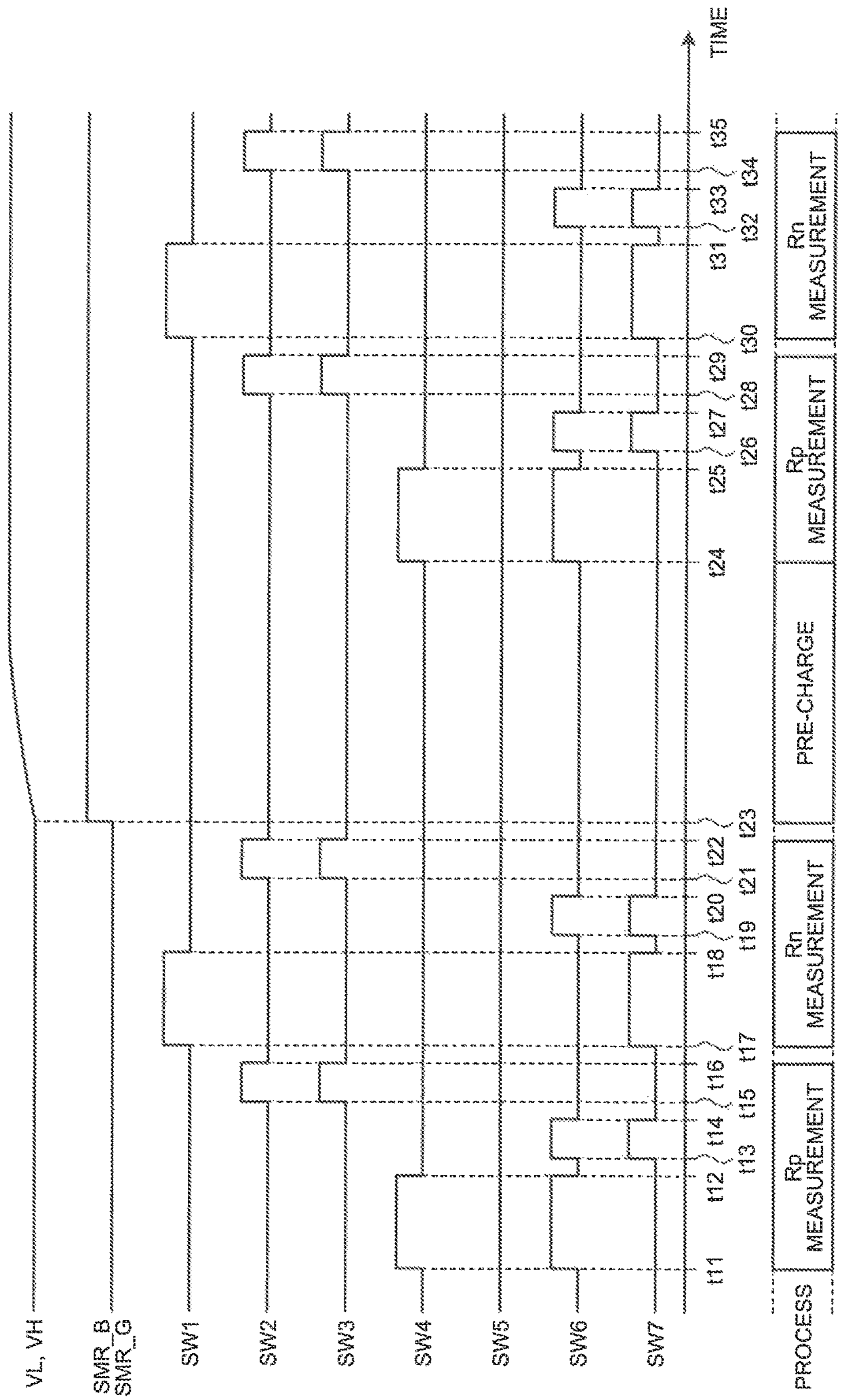
FIG. 6 is a timing chart illustrating an example of the insulation and welding detection process according to the first embodiment.
Figure 7A:
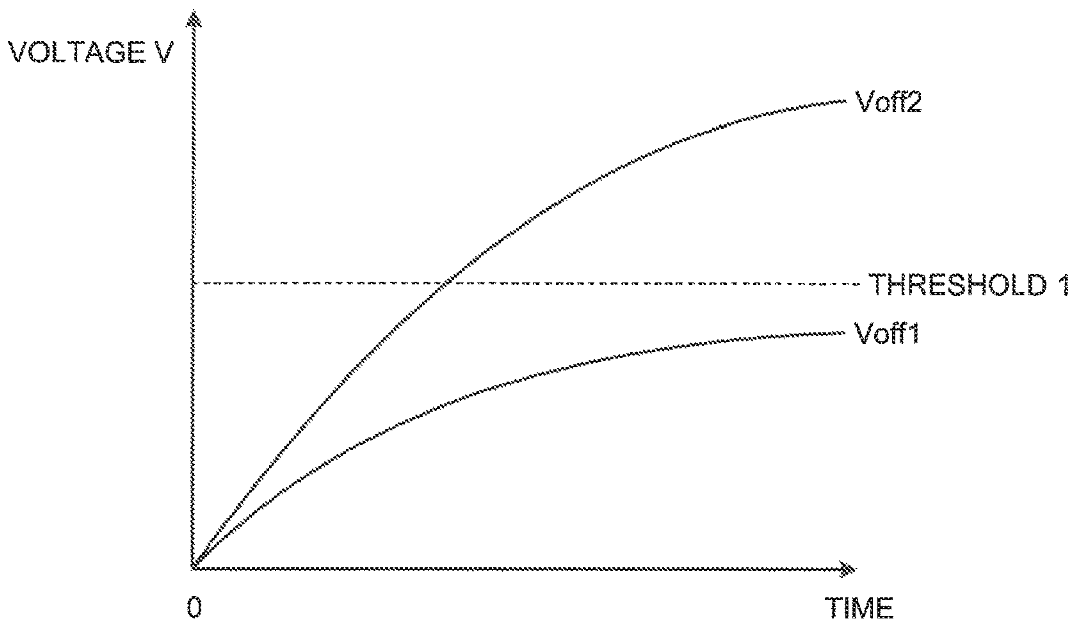
FIG. 7A is a diagram illustrating chronological changes in charging voltages of a flying capacitor at OFF of SMR according to the first embodiment.
Figure 7B:
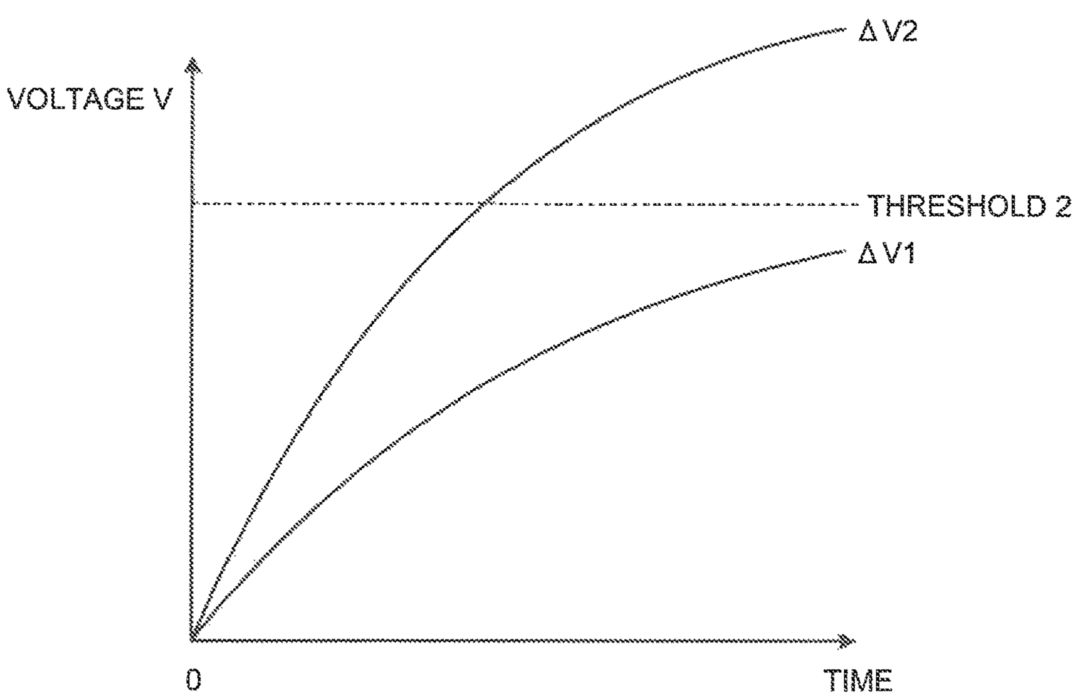
FIG. 7B is a diagram illustrating chronological changes in differences between charging voltages of the flying capacitor at OFF and ON of the SMR according to the first embodiment.

Timing Chart of Insulation and Welding Detection Process According to First Embodiment FIG. 6 is a timing chart illustrating an example of the insulation and welding detection process according to the first embodiment. FIG. 7A is a diagram illustrating a chronological change of a charging voltage of the flying capacitor at the OFF of the SMR according to the first embodiment. FIG. 7B is a diagram illustrating a chronological change of a difference between charging voltages of the flying capacitor at the OFF and ON of the SMR according to the first embodiment.

As illustrated in FIG. 6, the battery ECU 10 performs the Rp measurement in a time t11 to t16. The battery ECU 10 turns on the SW4 and SW6 to charge the flying capacitor in a time t11 to t12 during the Rp measurement.

The battery ECU 10 turns on the SW6 and SW7 to measure the voltage VRp1 by using A/D sampling of the voltage of the flying capacitor in a time t13 to t14. Then, the battery ECU 10 turns on the SW2 and SW3 to discharge the flying capacitor in a time t15 to t16.

The battery ECU 10 performs the Rn measurement in a time t17 to t22. The battery ECU 10 turns on the SW1 and SW7 to charge the flying capacitor in a time t17 to t18 during the Rn measurement.

The battery ECU 10 turns on the SW6 and SW7 to measure the voltage VRn1 by using A/D sampling of the voltage of the flying capacitor in a time t19 to t20. Then, the battery ECU 10 turns on the SW2 and SW3 to discharge the flying capacitor in a time t21 to t22.

Next, the battery ECU 10 controls the SMR_B and the SMR_G (namely, SMRs 3*a* and 3*b*) from the OFF state to the ON state after a timing t23. Along with the control, the low-voltage smoothing capacitor 23*a* (VL) and the high-voltage smoothing capacitor 23*b* (VH) are pre-charged to be substantially fully charged up to a timing t24.

Then, the battery ECU 10 performs the Rp measurement in a time t24 to t29. The battery ECU 10 turns on the SW4 and SW6 to charge the flying capacitor in a time t24 to t25 during the Rp measurement.

The battery ECU 10 turns on the SW6 and SW7 to measure the voltage VRp2 by using A/D sampling of the voltage of the flying capacitor in a time t26 to t27. Then, the battery ECU 10 turns on the SW2 and SW3 to discharge the flying capacitor in a time t28 to t29.

The battery ECU 10 performs the Rn measurement in a time t30 to t35. The battery ECU 10 turns on the SW1 and SW7 to charge the flying capacitor in a time t30 to t31 during the Rn measurement.

The battery ECU 10 turns on the SW6 and SW7 to measure the voltage VRn2 by using A/D sampling of the voltage of the flying capacitor in a time t32 to t33. Then, the battery ECU 10 turns on the SW2 and SW3 to discharge the flying capacitor in a time t34 to t35.

Herein, as illustrated in FIG. 6, a charge curve of the VL and VH is a curved line in which electric charge gradually increases up to an upper limit after the timing t23. After a predetermined time passes, the VL and VH become a fully charging state. When the VL (low-voltage smoothing capacitor 23*a*) becomes a fully charging state, "the SMR_B and the resistor 23*a*-1" and "the SMR_G and the resistor 23*a*-2" have the connected states when the SMR_B and the SMR_G (SMRs 3*a* and 3*b*) are controlled to be turned on. Then, electric charge corresponding to the resistor 23*a*-1 is charged into the flying capacitor in the case of the Vp measurement, and electric charge corresponding to the resistor 23*a*-2 is charged into the flying capacitor in the case of the Vn measurement. Herein, for example, when the SMR_B (SMR 3*a*) is welded, electric charge corresponding to the resistor 23*a*-1 is charged into the flying capacitor in the case of the Vp measurement even before the timing t23. Moreover, for example, when the SMR_G (SMR 3*b*) is welded, electric charge corresponding to the resistor 23*a*-2 is charged into the flying capacitor in the case of the Vn measurement even before the timing t23. Therefore, the voltage VRp1+VRn1 acquired in a time t11 to t22 becomes a voltage, not less than a predetermined threshold, which exceeds the voltage when there is not the welding of the SMR_B and the SMR_G (SMRs 3*a* and 3*b*) due to the influence of the welding of the SMR_B or the SMR_G (SMR 3*a* or 3*b*).

In other words, as illustrated in FIG. 7A, when the voltage VRp1+VRn1 becomes Voff2 not less than the threshold "1", there is a possibility that there is the welding in the ON state of the SMR_B or the SMR_G or the abnormality of the insulation resistance Rp or Rn. Moreover, as illustrated in FIG. 7A, when the voltage VRp1+VRn1 becomes Voff1 less than the threshold "1", there are not the welding in the ON state of the SMR_B and the SMR_G and the abnormality of the insulation resistances Rp and Rn. Step S29 in FIG. 3A is a determination process performed to isolate this abnormality.

For example, when the SMR_B is welded, electric charge corresponding to the resistor 23*a*-1 is charged into the flying capacitor in the case of the Vp measurement even before the timing t23. Moreover, for example, when the SMR_G is welded, electric charge corresponding to the resistor 23*a*-2 is charged into the flying capacitor in the case of the Vn measurement even before the timing t23. For this reason, the voltage VRp1+VRn1 acquired in a time t11 to t23 and the voltage VRp2+VRn2 acquired in a time t24 to t35 do not have a substantial difference because a charge voltage by the resistor 23*a*-1 or 23*a*-2 corresponding to the welded SMR is added to them.

For this reason, as illustrated in FIG. 7B, when a voltage {(VRp1+VRn1)−(VRp2+VRn2)} becomes ΔV1 less than the threshold "2", it can be determined that the welding of the SMR_B or the SMR_G (SMR 3*a* or 3*b*) comes about. Moreover, as illustrated in FIG. 7B, when the voltage {(VRp1+VRn1)−(VRp2+VRn2)} becomes ΔV2 more than the threshold "2", it can be determined that the abnormality of the insulation resistance Rp or Rn comes about instead of the welding of the SMR_B or the SMR_G (SMR 3*a* or 3*b*). Step S49 in FIG. 3B is a determination process performed to isolate this abnormality.

FIG. 8A is a diagram illustrating a charging voltage of the flying capacitor in states of the battery and the SMR according to the first embodiment. FIG. 8B is a diagram illustrating a chronological change of the charging voltage of the flying capacitor in states of the battery and the SMR according to the first embodiment. As illustrated in the table of FIG. BA, when the insulating state of the battery is normal and the SMR is normal, a total charging voltage V of the flying capacitor becomes zero substantially regardless of ON/OFF of the SMR. Moreover, when the insulating state of the battery is normal and the SMR is abnormal, the total charging voltage V of the flying capacitor becomes substantially equal to the charging voltage VL caused by ON of the SMR (or welding of SMR) regardless of ON/OFF of the SMR.

When the insulating state of the battery is abnormal and the SMR is normal, the total charging voltage V of the flying capacitor in the case of OFF of the SMR becomes substantially equal to the charging voltage Vp caused by the abnormality of the insulating state of the battery. Moreover, when the insulating state of the battery is abnormal and the SMR is normal, the total charging voltage V of the flying capacitor in the case of ON of the SMR becomes substantially equal to the sum Vp+VL of the charging voltage Vp caused by the abnormality of the insulating state of the battery and the charging voltage VL caused by ON of the SMR. Moreover, when the insulating state of the battery is abnormal and the SMR is abnormal, the total charging voltage V of the flying capacitor becomes substantially equal to Vp+VL regardless of ON/OFF of the SMR.

In other words, from FIG. 8A, when at least one of the insulating state of the battery or the SMR is abnormal or when both of the insulating state of the battery and the SMR are normal, it turns out that the abnormality or normality thereof can be determined on the basis of the charging voltage of the flying capacitor.

Therefore, like a curved line c1 illustrated in FIG. 88B, when the charging voltage V of the flying capacitor is less than a threshold (VL threshold) of the charging voltage VL caused by the welding at ON of the SMR after a time elapses sufficiently, it can be determined that both of the insulating state of the battery and the SMR are normal. Moreover, like a curved line c2 illustrated in FIG. 8B, when the charging voltage V of the flying capacitor is more than the VL threshold and is less than a threshold (Vp threshold) of the charging voltage Vp caused by the abnormality of the insulating state of the battery after a time elapses sufficiently, it can be determined that the SMR is abnormal and the insulating state of the battery is normal. Moreover, like a curved line c3 illustrated in FIG. 8B, when the charging voltage V of the flying capacitor exceeds the Vp threshold after a time elapses sufficiently, it can be determined that the SMR is normal and the insulating state of the battery is abnormal.

According to the first embodiment, in order to perform the welding detection of the SMR by using the circuit and process for the existing insulation detection, the welding detection of the SMR can be performed in simple control process and circuit configuration. Moreover, according to the first embodiment, because a relatively small-capacity flying capacitor consisting of the capacitor 12*c*-1 is used, a charge time or the like of the flying capacitor can be omitted, and thus a welding detection processing time of the SMR can be shortened. Moreover, because the in-vehicle system according to the first embodiment acquires the voltages Voff and Von at the time of ON of ignition of the vehicle and performs a threshold determination of a difference thereof, the in-vehicle system can perform the welding detection of the SMR even if the insulation resistance Rp or Rn is degraded. Moreover, according to the first embodiment, even if the SMR has a two-axis configuration of B axis and G axis, the welding detection of the SMR and the detection of which of the SMRs is welded can be performed by comparing the voltage VRp by the Rp measurement and the voltage VRn by the Rn measurement in the voltage Von. Moreover, according to the first embodiment, when the voltage Voff measured in the state where the SMR is turned off is less than a predetermined threshold, because the in-vehicle system determines that both of the insulation abnormality and welding do not come about and cancels the measurement of the voltage Von in the state where the SMR is turned on, processing efficiency can be achieved.

Second Embodiment

In the first embodiment, the insulation detection and the welding detection of the SMR are performed on the basis of the voltages Voff and Von acquired after IG_ON. However, the embodiment is not limited to this. The insulation detection and the welding detection of the SMR may be performed on the basis of the voltages Voff and Von acquired after IG_OFF. Hereinafter, an example in which the insulation detection and the welding detection of the SMR are performed on the basis of the voltages Voff and Von acquired after IG_OFF will be explained as a second embodiment about points different from the first embodiment.

Figure 9:
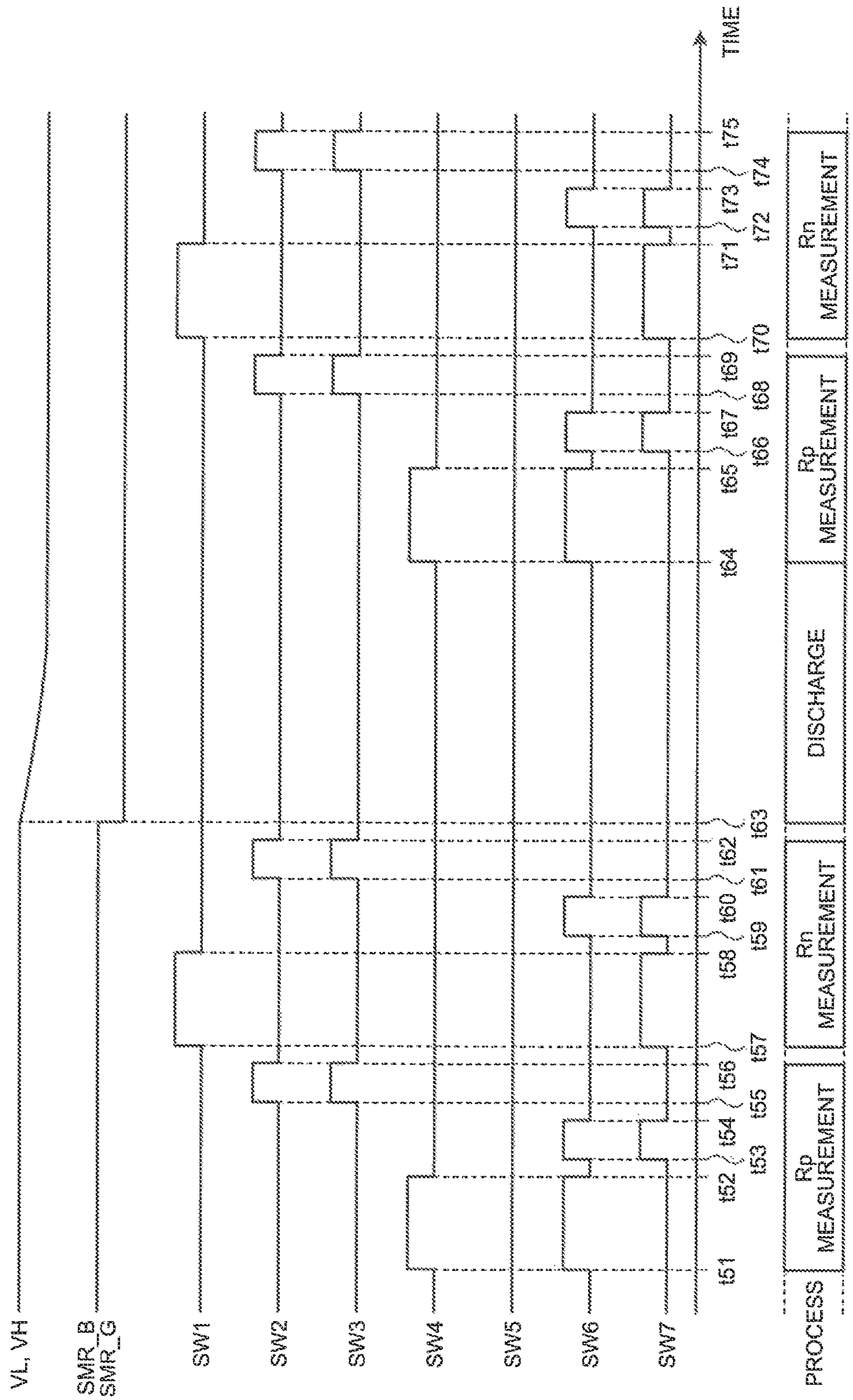
FIG. 9 is a timing chart illustrating an example of an insulation and welding detection process according to a second embodiment.

The second embodiment employs IG_ON→IG_OFF instead of IG_OFF→IG_ON in Step S11 of the insulation and welding detection process (see FIG. 3A) according to the first embodiment. FIG. 9 is a timing chart illustrating an example of an insulation and welding detection process according to the second embodiment.

ON-OFF controls of SW1 to SW7 in a time t51 to t62 and a time t64 to t75 illustrated in FIG. 9 according to the second embodiment are the same as ON-OFF controls of SW1 to SW7 in the time t11 to t22 and the time t24 to t35 illustrated in FIG. 6 according to the first embodiment. However, in the insulation and welding detection process according to the second embodiment, the battery ECU 10 controls the SMR_B and the SMR_G (namely, SMRs 3*a* and 3*b*) from an ON state to an OFF state after a timing t63. Along with the control, the low-voltage smoothing capacitor 23*a* (VL) and the high-voltage smoothing capacitor 23*b* (VH) are discharged to become a substantially discharged state up to a timing t64. As described above, because ON-OFF controls of the SMR_B (SMR 3*a*) and the SMR_G (SMR 3*b*) are performed even at the time of IG_OFF, welding detection can be performed similarly to the first embodiment.

In the meantime, among the processes described in the first and second embodiments, the whole or a part of processes that have been automatically performed can be manually performed. Alternatively, among the processes described in the first and second embodiments, the whole or a part of processes that have been manually performed can be automatically performed in a well-known method. Also, processing procedures, control procedures, concrete titles, and information including various types of data and parameters, which are described in the document and the drawings, can be arbitrarily changed except that they are specially mentioned.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An abnormality detection device comprising:

a controller configured to:

while a power supply, a capacitor, a load circuit, a switch connecting the power supply to the load circuit, and a ground of a vehicle body are mounted on a vehicle, obtain a first voltage of the capacitor charged by serially connecting the power supply, the capacitor, and the ground of the vehicle body in a state where the switch is controlled to be in an OFF state; and when the first voltage is less than a first threshold, determine that (i) the switch is not fixed in an ON state and (ii) an insulation resistance of the vehicle is normal.

2. The abnormality detection device according to claim 1, wherein the controller is configured to:

obtain the first voltage at a time of ON of ignition of the vehicle.

3. The abnormality detection device according to claim 2, wherein the controller is configured to:

when the first voltage is not less than the first threshold, obtain a second voltage of the capacitor charged by serially connecting the power supply, the capacitor, and the ground of the vehicle body in a state where the switch is controlled to be turned on in an ON state;

when a voltage difference between the first voltage and the second voltage is not less than a second threshold, determine whether the insulation resistance of the vehicle is normal; and when the voltage difference is less than the second threshold, determine whether the switch is normal.

4. The abnormality detection device according to claim 3, wherein:

the switch includes a first switch that connects a positive side of the power supply to the load circuit and a second switch that connects a negative side of the power supply to the load circuit;

the second voltage is a summed voltage of a third voltage of the capacitor charged by serially connecting the positive side of the power supply, the capacitor, and the ground of the vehicle body and a fourth voltage of the capacitor charged by serially connecting the negative side of the power supply, the capacitor, and the ground of the vehicle body in a state where both of the first switch and the second switch are controlled to be in an ON state;

the determining unit, controller is configured to:

when the voltage difference between the first voltage and the second voltage is less than the second threshold:

determine that the first switch is fixed in the ON state when the third voltage is not less than the fourth voltage; and determine that the second switch is fixed in the ON state when the third voltage is less than the fourth voltage.

5. The abnormality detection device according to claim 1, wherein the controller is configured to:

obtain the first voltage at a time of OFF of ignition of the vehicle.

6. The abnormality detection device according to claim 5, wherein the controller is configured to:

when the first voltage is not less than the first threshold, obtain a second voltage of the capacitor charged by serially connecting the power supply, the capacitor, and the ground of the vehicle body in a state where the switch is controlled to be in an ON state;

when a voltage difference between the first voltage and the second voltage is not less than a second threshold, determine whether the insulation resistance of the vehicle is normal; and when the voltage difference is less than the second threshold, determine whether the switch is normal.

7. The abnormality detection device according to claim 6, wherein:

the switch includes a first switch that connects a positive side of the power supply to the load circuit and a second switch that connects a negative side of the power supply to the load circuit;

the second voltage is a summed voltage of a third voltage of the capacitor charged by serially connecting the positive side of the power supply, the capacitor, and the ground of the vehicle body and a fourth voltage of the capacitor charged by serially connecting the negative side of the power supply, the capacitor, and the ground of the vehicle body in a state where both of the first switch and the second switch are controlled to be in an ON state;

the controller is configured to:

when the voltage difference between the first voltage and the second voltage becomes is less than the second threshold:

determine that the first switch is fixed in the ON state when the third voltage is not less than the fourth voltage; and determine that the second switch is fixed in the ON state when the third voltage is less than the fourth voltage.

8. The abnormality detection device according to claim 1, wherein the controller is configured to:

when the first voltage is not less than the first threshold, obtain a second voltage of the capacitor charged by serially connecting the power supply, the capacitor, and the ground of the vehicle body in a state where the switch is controlled to be in an ON state;

when a voltage difference between the first voltage and the second voltage is not less than a second threshold, determine whether the insulation resistance of the vehicle is normal; and when the voltage difference is less than the second threshold, determine whether the switch is normal.

9. The abnormality detection device according to claim 8, wherein:

the switch includes a first switch that connects a positive side of the power supply to the load circuit and a second switch that connects a negative side of the power supply to the load circuit;

the second voltage is a summed voltage of a third voltage of the capacitor charged by serially connecting the positive side of the power supply, the capacitor, and the ground of the vehicle body and a fourth voltage of the capacitor charged by serially connecting the negative side of the power supply, the capacitor, and the ground of the vehicle body in a state where both of the first switch and the second switch are controlled to be in an ON state;

the controller is configured to:

when the voltage difference between the first voltage and the second voltage is less than the second threshold:

determine that the first switch is fixed in the ON state when the third voltage is not less than the fourth voltage; and determine that the second switch is fixed in the ON state when the third voltage is less than the fourth voltage.

10. An abnormality detection method comprising:

while a power supply, a capacitor, a load circuit, a switch connecting the power supply to the load circuit, and a ground of a vehicle body are mounted on a vehicle, obtaining a first voltage of the capacitor charged by serially connecting the power supply, the capacitor, and the ground of the vehicle body in a state where the switch is controlled to be in an OFF state; and when the first voltage is less than a first threshold, determining that (i) the switch is not fixed in an ON state and (ii) an insulation resistance of the vehicle is normal.

11. The abnormality detection method according to claim 10, wherein:

the switch includes a first switch that connects a positive side of the power supply to the load circuit and a second switch that connects a negative side of the power supply to the load circuit; and the method further comprises:

when the first voltage is not less than the first threshold, obtaining a second voltage of the capacitor that is a summed voltage of a third voltage of the capacitor charged by serially connecting the positive side of the power supply, the capacitor, and the ground of the vehicle body and a fourth voltage of the capacitor charged by serially connecting the negative side of the power supply, the capacitor, and the ground of the vehicle body in a state where both of the first switch and the second switch are controlled to be in an ON state;

when a voltage difference between the first voltage and the second voltage is not less than a second threshold, determining whether the insulation resistance of the vehicle is normal; and when the voltage difference is less than the second threshold:

determining that the first switch is fixed in the ON state when the third voltage is not less than the fourth voltage; and determining that the second switch is fixed in the ON state when the third voltage is less than the fourth voltage.

* * * * *